(12) United States Patent
Tseng et al.

(10) Patent No.: US 9,208,043 B1
(45) Date of Patent: Dec. 8, 2015

(54) METHOD AND APPARATUS FOR FAULT INJECTION AND VERIFICATION ON AN INTEGRATED CIRCUIT

(71) Applicant: Xilinx, Inc., San Jose, CA (US)

(72) Inventors: Chen W. Tseng, Longmont, CO (US); Restu I. Ismail, San Jose, CA (US); Robert Le, San Jose, CA (US)

(73) Assignee: XILINX, INC., San Jose, CA (US)

( * ) Notice: Subject to any disclaimer, the term of this patent is extended or adjusted under 35 U.S.C. 154(b) by 235 days.

(21) Appl. No.: 13/842,140

(22) Filed: Mar. 15, 2013

(51) Int. Cl.
*G06F 11/00* (2006.01)
*G06F 11/263* (2006.01)

(52) U.S. Cl.
CPC .................................. *G06F 11/263* (2013.01)

(58) Field of Classification Search
CPC .......................... G06F 11/3672; G06F 11/221
See application file for complete search history.

(56) References Cited

U.S. PATENT DOCUMENTS

| 4,759,019 | A  | * | 7/1988  | Bentley et al. ................. 714/703 |
| 5,561,762 | A  | * | 10/1996 | Smith et al. ...................... 714/33 |
| 5,596,587 | A  | * | 1/1997  | Douglas et al. ................ 714/739 |
| 7,143,329 | B1 |   | 11/2006 | Trimberger et al. |
| 7,249,010 | B1 |   | 7/2007  | Sundararajan et al. |
| 7,406,673 | B1 |   | 7/2008  | Patterson et al. |
| 7,620,883 | B1 |   | 11/2009 | Carmichael et al. |
| 8,146,028 | B1 |   | 3/2012  | Lesea |
| 2010/0005041 | A1 | * | 1/2010 | Wang ............................... 706/12 |
| 2012/0131417 | A1 |   | 5/2012 | Rodriguez et al. |
| 2013/0096902 | A1 | * | 4/2013 | Bose et al. ........................ 703/14 |
| 2014/0217406 | A1 | * | 8/2014 | Thomas ........................... 257/48 |

OTHER PUBLICATIONS

U.S. Appl. No. 13/842,502, filed Mar. 15, 2013, Tseng et al.
Xilinx, *LogiCORE IP Soft Error Mitigation Controller v3.4*, PG036, Dec. 18, 2012, pp. 1-166, Xilinx, Inc., San Jose, California, USA.

* cited by examiner

*Primary Examiner* — Amine Riad
(74) *Attorney, Agent, or Firm* — Kin-Wah Tong

(57) ABSTRACT

A method, non-transitory computer readable medium, and apparatus for performing fault injection and verification on an integrated circuit are disclosed. For example, the method generates a mask file for one or more modules of a hierarchical design, wherein the mask file identifies one or more essential bits, receives a selection of one of the one or more modules as a selected module for the fault injection and the verification to be applied, performs the fault injection on at least one essential bit of the selected module based upon the mask file for the selected module, and performs the verification on the selected module.

20 Claims, 4 Drawing Sheets

0000100000001000000010000001000 ⟵ 302

METHOD AND APPARATUS FOR FAULT INJECTION AND VERIFICATION ON AN INTEGRATED CIRCUIT

TECHNICAL FIELD

The present disclosure relates generally to the testing of integrated circuits (ICs), and more particularly to a method and apparatus for fault injection and verification on an IC.

BACKGROUND

Integrated circuits (ICs), e.g., programmable ICs such as field programmable gate arrays (FPGAs), may require emulation and verification. One method of emulation may include testing the IC in a radiation facility. However, there are a limited number of radiation facilities that can perform such emulation. In addition, there may be a limited number of engineers that can operate the beams used in the radiation facilities. As a result, testing at a radiation facility may be cost and resource prohibitive.

Another method of emulation may include error injection for an entire design, i.e., every single module within the design implemented in the programmable IC is injected with errors. However, verification of each bit may require more time than the time required to inject the error (e.g., seconds or minutes as opposed to hundredths of micro seconds for the injection). As a result, performing error injection on the entire design may be impractical.

SUMMARY

The present disclosure provides a method for performing fault injection and verification on an integrated circuit. For example, the method can comprise: generating, by a processor, a mask file for one or more modules of a hierarchical design, wherein the mask file identifies one or more essential bits, receiving, by the processor, a selection of one of the one or more modules as a selected module for the fault injection and the verification to be applied, performing, by the processor, the fault injection on at least one essential bit of the selected module based upon the mask file for the selected module, and performing, by the processor, the verification on the selected module.

In various embodiments: the performing the fault injection and the verification are repeated until a time limit is reached; the performing the fault injection and the verification are repeated until a desired percentage of the at least one essential bit is verified; the percentage comprises a number of essential bits that is verified divided by a total number of essential bits in the mask file; the at least one essential bit in the mask file is represented by a value of one and one or more non-essential bits in the mask file are represented by a value of zero; the method further comprises providing, by the processor, a physical address for each one of the at least one essential bit for which the fault injection and the verification were performed; each one of the one or more modules of the hierarchical design is restricted to a known area within the integrated circuit; the physical address is determined based upon a mapping of a frame address of the known area where the selected module is located and the mask file; and/or the integrated circuit comprises a field programmable gate array.

The present disclosure also provides a non-transitory computer-readable medium storing a plurality of instructions which, when executed by a processor, cause the processor to perform operations for performing fault injection and verification on an integrated circuit. For example, the non-transitory computer-readable medium comprises a plurality of instructions for: generating a mask file for one or more modules of a hierarchical design, wherein the mask file identifies one or more essential bits, receiving a selection of one of the one or more modules as a selected module for the fault injection and the verification to be applied, performing the fault injection on at least one essential bit of the selected module based upon the mask file for the selected module, and performing the verification on the selected module.

The present disclosure also provides an apparatus for performing fault injection and verification on an integrated circuit. For example, the apparatus can comprise a processor and a computer-readable medium storing a plurality of instructions which, when executed by the processor, cause the processor to perform operations, the operations comprising: generating a mask file for one or more modules of a hierarchical design, wherein the mask file identifies one or more essential bits, receiving a selection of one of the one or more modules as a selected module for the fault injection and the verification to be applied, performing the fault injection on at least one essential bit of the selected module based upon the mask file for the selected module, and performing the verification on the selected module.

BRIEF DESCRIPTION OF THE DRAWINGS

Accompanying drawings show exemplary circuits and methods in accordance with one or more aspects of the invention. However, the accompanying drawings should not be taken to limit the invention to the examples shown, but are for explanation and understanding only.

To facilitate understanding, identical reference numerals have been used, where possible, to designate identical elements that are common to the figures.

DETAILED DESCRIPTION

The present disclosure broadly discloses a method, non-transitory computer readable medium, and apparatus for performing fault injection and verification on a programmable integrated circuit. As discussed above, integrated circuits may require emulation and verification. One method of emulation and verification may include the testing of the programmable IC in a radiation facility. However, since there are only a limited number of radiation facilities that can perform such emulation and there may be a limited number of engineers that can properly operate the beams used in these radiation facilities, this method of emulation and verification is not always practical.

Another method of emulation may include error injection for an entire design, i.e., subjecting every single module within the design to error injection. However, verification of each bit may require more time than the time required to inject the error (e.g., seconds or minutes as opposed to hundredths of micro seconds for the injection). As a result, performing error injection on the entire design may be impractical due to the overall time that will be needed to complete the emulation and verification process.

Figures 1, 3:
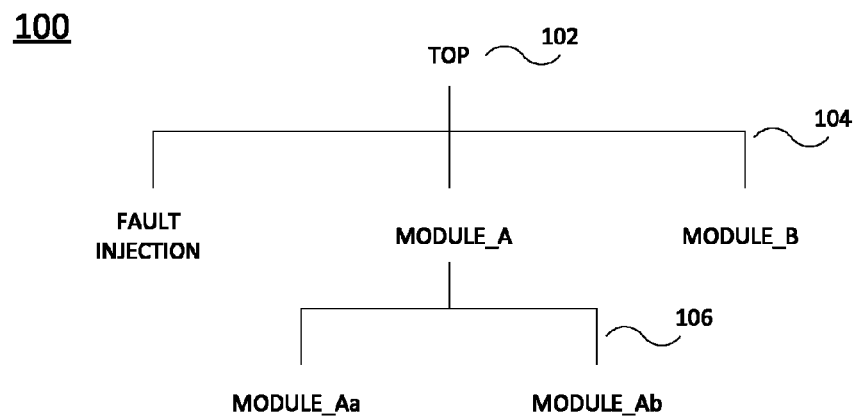
FIG. 1 illustrates one example block diagram of a hierarchical design.
FIG. 3 illustrates one example of a mask file.

FIG. 1 shows an exemplary method for performing fault injection and verification that allows users to specify important or critical modules within the hierarchical design and only perform fault injection and verification on essential bits of the specified module or modules. Specifically, FIG. 1 illustrates a high level block diagram of a hierarchical design 100. The hierarchical design may be created in a program executed on a general purpose computer illustrated in FIG. 5 and discussed below, for example. One example program may be the Vivado® software from Xilinx Corporation®.

Hierarchical design 100 includes a top level 102, a second level 104, and a third level 106. Although three levels are illustrated in FIG. 1, it should be noted that any number of levels may be deployed in the hierarchical design 100. In the pictured example, the second level 104 includes a fault injection module, a module_A, and a module B, and the third level 106 includes one or more sub-modules of module_A, i.e., module_Aa and module_Ab.

In one embodiment, each one of the modules that is created in the hierarchical design 100 may be created and implemented such that each module is carved out of the hierarchical design 100 and decoupled from the hierarchical design 100. In other words, the modules may be created such that each module is restricted to a known area within the device and ensures that no cross pollination of the module logic will occur.

In one embodiment, creating each module such that each module is restricted to a known area within the device allows a physical address to be derived. This will allow a user to have confidence in that the fault injection and verification is performed on a specific module that was selected, as will be discussed below.

Figure 2:
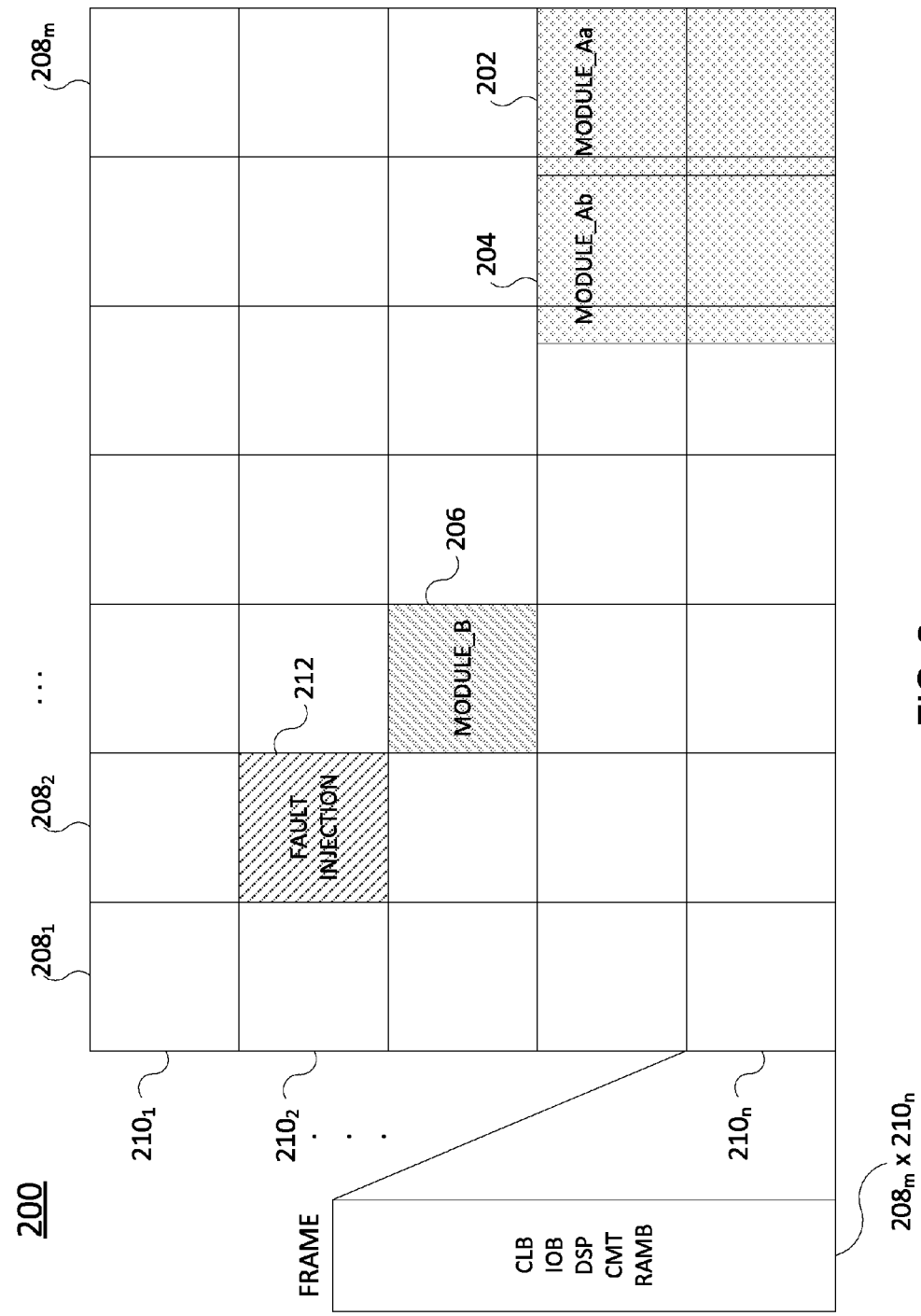
FIG. 2 illustrates one example of a block diagram of an FPGA.

FIG. 2 illustrates a block diagram of one example of an IC, e.g., a programmable IC 200. Programmable IC 200 includes a plurality of columns $208_1$ to $208_m$ (also referred to collectively as columns 208) and a plurality of rows $210_1$ to $210_n$ (also referred to collectively as rows 210). A combination of one of the columns $208_m$ and one of the rows $210_n$ may create a frame of a clock region $208_m \times 210_n$. Each frame may include various parts, such as control logic blocks (CLBs), digital signal processors (DSPs), input/output blocks (IOBs), clock management tiles (CMTs), block random access memory (RAMBs), and the like.

For example, a height of each row $210_1$ to $210_n$ may include slices of CLBs, RAMBs, DSPs, and so forth. Said another way, each frame may span the height of a clock region. Each column $208_1$ to $208_m$ may be composed of a plurality of frames.

FIG. 2 illustrates a location of each one of the modules from the hierarchical design 100 illustrated in FIG. 1. For example, programmable IC 200 includes the module_Ab 202 and the module_Ab 204 (which together form the entire module_A), the module_B 206, and the fault injection module 212. The modules may span at least the height of a row 210. However, the modules may take up one or more columns 208 and/or one or more rows 210 (e.g., module_Aa 202 and module_Ab 204 span over two rows and three columns).

As noted above, the modules 202, 204, 206, and 212 are in known locations within programmable IC 200. In one example, the modules 202, 204, 206, and 212 are constrained via area group (AG) constraints. The AG has the property of being able to contain only related module logic and ensure that module routing, other than interface routing, stays within the AG. This prevents cross pollination, as noted above, and allows the module to be a fully independent module carved out of the hierarchical design 100. In addition, by being in known locations, a physical address of each bit that is tested within each of the modules 202, 204, or 206 may be derived from a frame address of the respective modules 202, 204, or 206.

As noted above, previous methods required testing of the entire hierarchical design. Due to the longer processing times for performing the verification, this limitation may make performing fault injection and verification for emulation impractical. However, the methods described herein allow a user to perform fault injection and verification on a specific module. For example, one or more of the modules 202, 204, or 206 may be deemed a critical module. Specific modules may be selected, since the hierarchical modules 202, 204, and 206 are created in a known area within programmable IC 200.

Furthermore, only essential bits within each of the selected modules 202, 204, or 206 may be fault injected and verified, if desired, using a mask file. For example, the mask file may have the same format as a readback file, except that the mask file may include a dummy frame as the first frame. Additionally or alternatively, the mask file may differ in that it may be a binary file that only includes 1's" and "0's". For example, an essential bit within a module may be marked by a value of 1 in the mask file. A non-essential bit within a module may be marked by a value of 0 in the mask file. One example of a mask file 302 is illustrated in FIG. 3.

Knowledge by the designers of the modules 202, 204, and 206 may be used to determine which bits within each one of the modules 202, 204, and 206 are considered to be essential. The mask file may be created for the entire hierarchical design 100 and then divided up into portions that correspond to each one of the modules 202, 204, and 206. The mask file may be verified by fault injecting or changing one or more non-essential bits to confirm that the change has no effect on the performance or functionality of the module.

The frame address of the modules 202, 204, and 206 may be mapped to the mask file to derive the physical address of the essential bits that are fault injected and verified. As a result, the physical address information may be provided to the user. In addition, the user may have confidence that the proper module was fault injected and verified.

As a result, specific modules within the IC that may be deemed to be critical or important may be tested if there is only a limited amount of time or resources available. In addition, the fault injection and verification may be limited by a desired module verification percentage of essential bits that a user wants to test. Thus, using a combination of a hierarchical design flow that creates modules in a known area of the IC and a mask file that indicates the essential bits of the module provides an efficient method for performing fault injection and verification on an IC.

Figure 4:
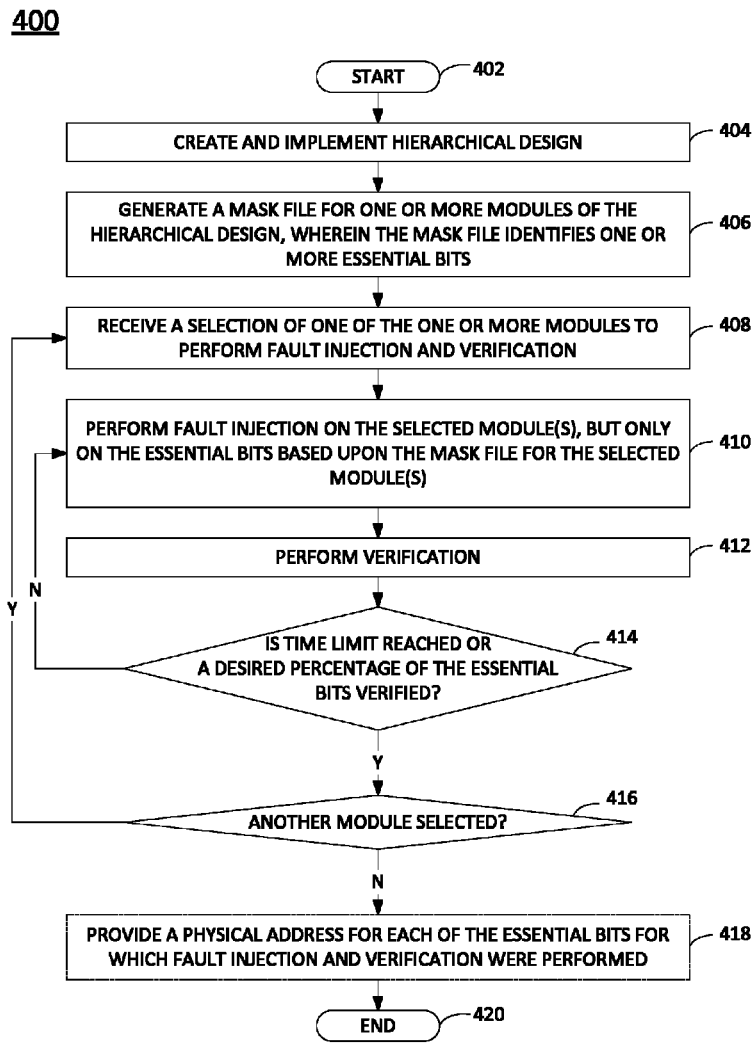
FIG. 4 illustrates an example flowchart of a method for performing fault injection and verification.
Figure 5:
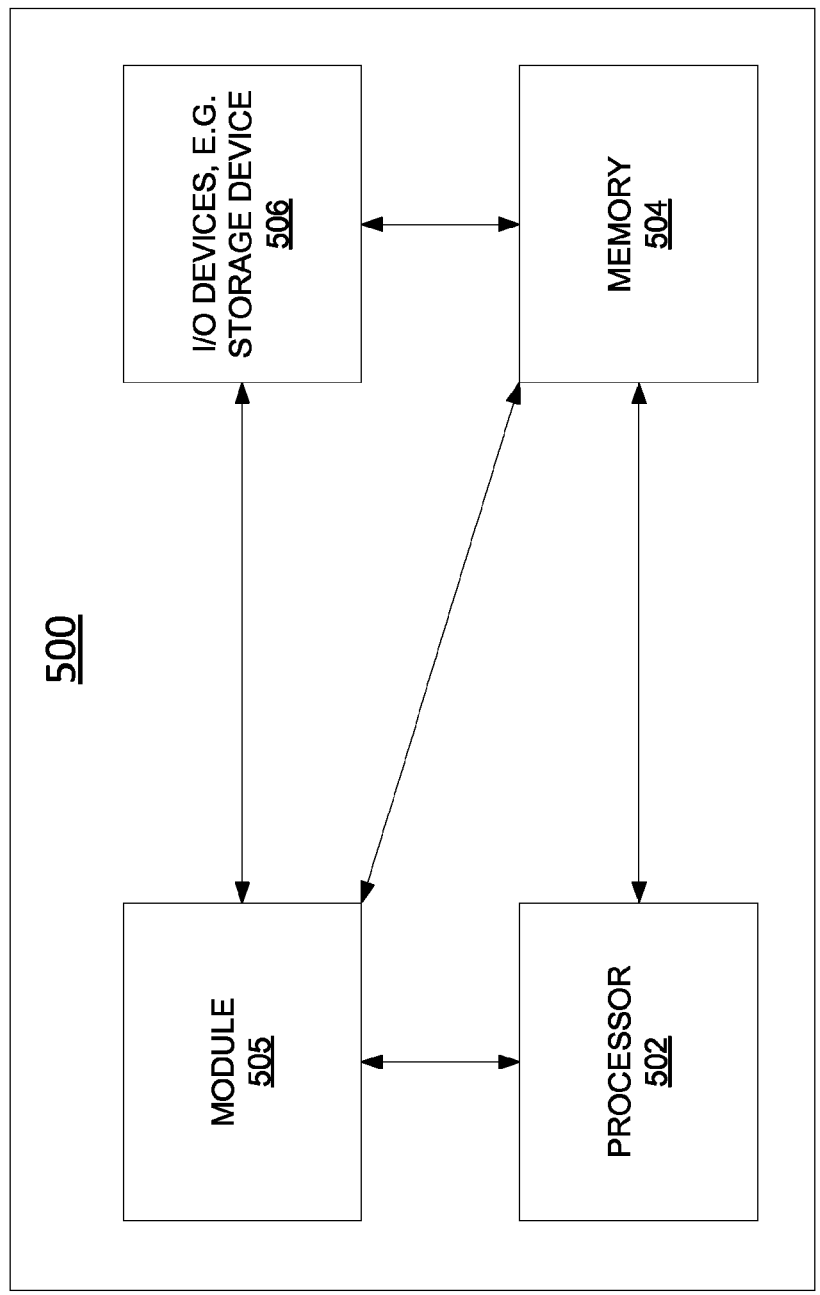
FIG. 5 illustrates a high-level block diagram of a general-purpose computer suitable for use in performing the functions described herein.

FIG. 4 illustrates a flowchart of a method 400 for performing fault injection and verification on an IC. The method 400 may be performed by a general purpose computer as illustrated in FIG. 5 and discussed below, for example.

The method 400 begins at step 402. At step 404, the method 400 creates and implements a hierarchical design. For example, a program such as the Vivado® software produced by Xilinx Corporation® running on a general purpose computer can be used to create and implement the hierarchical design.

As discussed above, each one of the modules that is specified in the hierarchical design 100 may be created and implemented, such that each module is carved out of the hierarchical design 100 and decoupled from the hierarchical design 100. In other words, the modules may be created such that each module is restricted to a known area within the device and ensures that no cross pollination of the module logic occurs.

The modules can be constrained via AG constraints, for example. The AG has the property of being able to contain only related module logic and ensure module routing, other than interface routing, must stay within the AG. This prevents cross pollination, as noted above, and allows the module to be a fully independent module carved out of the hierarchical design. In addition, by being in known locations, a physical address of each bit that is tested within a module may be derived from a frame address of the modules.

Implementing the modules may be defined as fully compiling the modules of the hierarchical design to be ready for use or deployment. For example, all the run files of the modules may be executed within the design program to ensure that each module is error free, or that all failures are within the expectations of the designer.

At step 406, the method 400 generates a mask file for one or more modules of the hierarchical design, wherein the mask file identifies one or more essential bits. Knowledge by the designers of the modules may be used to determine which bits within each one of the modules are considered to be essential. The mask file may be created for the entire hierarchical design 100 and then divided up into portions that correspond to each one of the modules.

The mask file ensures that only essential bits within each of the selected modules are fault injected and verified. The mask file may have the same format as a readback file, except that the mask file may include a dummy frame as the first frame. In addition, the mask file may differ in that it may be a binary file that only includes "1's" and "0's". In one example, an essential bit within a module is marked by a value of 1 in the mask file, and a non-essential bit within a module is marked by a value of 0 in the mask file. This method of marking is only illustrative and can be implemented vice versa, if desired. If desired, the mask file may be verified by fault injecting or changing one or more non-essential bits to confirm that the change has no effect on the performance or functionality of the module.

At step 408, the method 400 receives a selection of one of the one or more modules (broadly referred to as the selected module(s)) to perform fault injection and verification. For example, the user may select any one of the modules of the hierarchical design that is considered to be critical or important. In addition, the user may set a desired level of verification for the selected modules. For example, the user may decide that they only need 70% verification performed on the module, due to time or budget constraints. The module verification percentage may be calculated, for example, by a number of essential bits that are fault injected and verified divided by a total number of essential bits in the selected module. Thus, if there are 10 essential bits in the selected module, then only 7 out of the 10 essential bits are fault injected and verified for a 70% verification. This is only an example and should not be interpreted as a limitation of the present disclosure.

At step 410, the method 400 performs fault injection on the selected module(s), but only on the essential bits based upon the mask file for selected module(s). For example, a fault can be intentionally created at one of the essential bits. Any method of fault injection consistent with the present disclosure can be used.

At step 412, the method 400 performs the verification. The verification may comprise ensuring that the system reacts in a predictable manner or will behave correctly in response to the injected fault in the module. Any method of verification consistent with the present disclosure can be used.

At step 414, the method 400 determines if a time limit is reached or a desired percentage of the essential bits have been verified. For example, as noted in step 408, a user may determine a desired percentage of fault injection and verification that needs to be performed on the selected module. Additionally or alternatively, a time limit may be set to perform the fault injection and verification, e.g., one or more seconds, one or more minutes, and the like. If the answer to step 414 is negative, the method 400 loops back to step 410 and repeats (or simply continues) steps 410 and 412, e.g., for the next essential bit, and so on. If the answer to step 414 is affirmative, the method 400 proceeds to step 416.

At step 416, the method 400 determines if another module is selected. For example, the fault injection and verification can be performed on any number of modules that a user deems to be important or critical. If the answer to step 416 is affirmative, the method 400 loops back to step 408 and repeats steps 408, 410, 412, and 414. If the answer to step 416 is negative, the method 400 proceeds to optional step 418.

At optional step 418, the method 400 may provide a physical address for each one of the essential bits for which fault injection and verification were performed. For example, the physical address may be derived from a frame address mapped to the mask file, as discussed above. The method 400 ends at step 420.

It should be noted that although not explicitly specified, one or more steps of the method 400 described above may include a storing, displaying and/or outputting step as required for a particular application. In other words, any data, records, fields, and/or intermediate results discussed in the methods can be stored, displayed, and/or outputted to another device as required for a particular application. Furthermore, steps, operations, or blocks in FIG. 4 that recite a determining operation, or involve a decision, do not necessarily require that both branches of the determining operation be practiced. In other words, one of the branches of the determining operation can be deemed as an optional step.

FIG. 5 depicts a high level block diagram of a general purpose computer, a computing device, or a computing system 500 suitable for use in performing some or all of the functions described herein. As depicted in FIG. 5, the system 500 comprises a hardware processor element 502 (e.g., a CPU), a memory 504, e.g., random access memory (RAM) and/or read only memory (ROM), a module 505 for performing fault injection and verification for an IC, and various input/output devices 506, e.g., storage devices, including but not limited to, a tape drive, a floppy drive, a hard disk drive or a compact disk drive, a receiver, a transmitter, a speaker, a display, a speech synthesizer, an output port, and/or a user input device (such as a keyboard, a keypad, a mouse, and the like).

It should be noted that the present disclosure can be implemented in software and/or in a combination of software and hardware, e.g., using application specific integrated circuits (ASIC), a general purpose computer, or any other hardware equivalents, e.g., computer readable instructions pertaining to the method(s) discussed above can be used to configure a hardware processor to perform the steps or operations of the above disclosed method. In other words, these methods can be implemented in a combination of software and hardware, e.g., using application specific integrated circuits (ASIC), a programmable IC such as a FPGA, a general purpose computer, or any other hardware equivalents such as microprocessors. The module or process 505 for performing fault injection and verification for an IC can be loaded into memory 504 and executed by hardware processor 502 to implement the functions, as discussed above. As such, the exemplary methods (including associated data structures) of the present disclosure can be stored on a non-transitory (e.g., tangible or physical) computer readable storage medium, e.g., RAM memory, magnetic or optical drive or diskette, and the like.

The exemplary methods and apparatus may also be implemented in whole or in part by a programmable IC, e.g., a programmable logic device (PLD) and/or an FPGA. A PLD is a general-purpose device that can be programmed by a user to implement a variety of selected functions. One type of PLD is a Field Programmable Gate Array (FPGA), which typically includes an array of configurable logic blocks (CLBs) and a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data (e.g., from general purpose computer 500) into associated memory cells that control various switches and multiplexers within the CLBs, IOBs, and the interconnect structure to implement logic and routing functions specified by the configuration data to implement a user design in the FPGA. An FPGA may also include other programmable and non-programmable resources.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for performing fault injection and verification on an integrated circuit including a plurality of modules arranged in a hierarchical design, the method comprising:
   generating, by a processor, a mask file for one or more modules of the plurality of modules of the hierarchical design, wherein the mask file identifies one or more essential bits;
   receiving, by the processor, a selection of one of the one or more modules as a selected module for the fault injection and the verification to be applied;
   performing, by the processor, the fault injection on at least one essential bit of the selected module based upon the mask file for the selected module; and
   performing, by the processor, the verification on the selected module, wherein the fault injection and the verification are limited to the selected module.

2. The method of claim 1, wherein the performing the fault injection and the verification are repeated until a time limit is reached.

3. The method of claim 1, wherein the performing the fault injection and the verification are repeated until a desired percentage of the at least one essential bit is verified.

4. The method of claim 3, wherein the percentage comprises a number of essential bits that is verified divided by a total number of essential bits in the mask file.

5. The method of claim 1, wherein the at least one essential bit in the mask file is represented by a value of one and one or more non-essential bits in the mask file are represented by a value of zero.

6. The method of claim 1, further comprising:
   providing, by the processor, a physical address for each one of the at least one essential bit for which the fault injection and the verification were performed.

7. The method of claim 6, wherein each one of the plurality of modules of the hierarchical design is restricted to a known area within the integrated circuit.

8. The method of claim 7, wherein the physical address is determined based upon a mapping of a frame address of the known area where the selected module is located and the mask file.

9. The method of claim 1, wherein the integrated circuit comprises a field programmable gate array.

10. A non-transitory computer-readable medium storing a plurality of instructions which, when executed by a processor, cause the processor to perform operations for performing fault injection and verification on an integrated circuit including a plurality of modules arranged in a hierarchical design, the operations comprising:
    generating a mask file for one or more modules of the plurality of modules of the hierarchical design, wherein the mask file identifies one or more essential bits;
    receiving a selection of one of the one or more modules as a selected module for the fault injection and the verification to be applied;
    performing the fault injection on at least one essential bit of the selected module based upon the mask file for the selected module; and
    performing the verification on the selected module, wherein the fault injection and the verification are limited to the selected module.

11. The non-transitory computer-readable medium of claim 10, wherein the performing the fault injection and the verification are repeated until a time limit is reached.

12. The non-transitory computer-readable medium of claim 10, wherein the performing the fault injection and the verification are repeated until a desired percentage of the at least one essential bit is verified.

13. The non-transitory computer-readable medium of claim 12, wherein the percentage comprises a number of essential bits that is verified divided by a total number of essential bits in the mask file.

14. The non-transitory computer-readable medium of claim 10, wherein the at least one essential bit in the mask file is represented by a value of one and one or more non-essential bits in the mask file are represented by a value of zero.

15. The non-transitory computer-readable medium of claim 10, further comprising:
    providing a physical address for each one of the at least one essential bit for which the fault injection and the verification were performed.

16. The non-transitory computer-readable medium of claim 15, wherein each one of the plurality of modules of the hierarchical design is restricted to a known area within the integrated circuit.

17. The non-transitory computer-readable medium of claim 16, wherein the physical address is determined based upon a mapping of a frame address of the known area where the selected module is located and the mask file.

18. The non-transitory computer-readable medium of claim 10, wherein the integrated circuit comprises a field programmable gate array.

19. An apparatus for performing fault injection and verification on an integrated circuit including a plurality of modules arranged in a hierarchical design, the apparatus, comprising:
- a processor; and
- a computer-readable medium storing a plurality of instructions which, when executed by the processor, cause the processor to perform operations, the operations comprising:
  - generating, by a processor, a mask file for one or more modules of the plurality of modules of the hierarchical design, wherein the mask file identifies one or more essential bits;
  - receiving a selection of one of the one or more modules as a selected module for the fault injection and the verification to be applied;
  - performing the fault injection on at least one essential bit of the selected module based upon the mask file for the selected module; and
- performing, by the processor, the verification on the selected module, wherein the fault injection and the verification are limited to the selected module.

20. The apparatus of claim 19, wherein the performing the fault injection and the verification are repeated until a time limit is reached.

* * * * *